Figure 2:
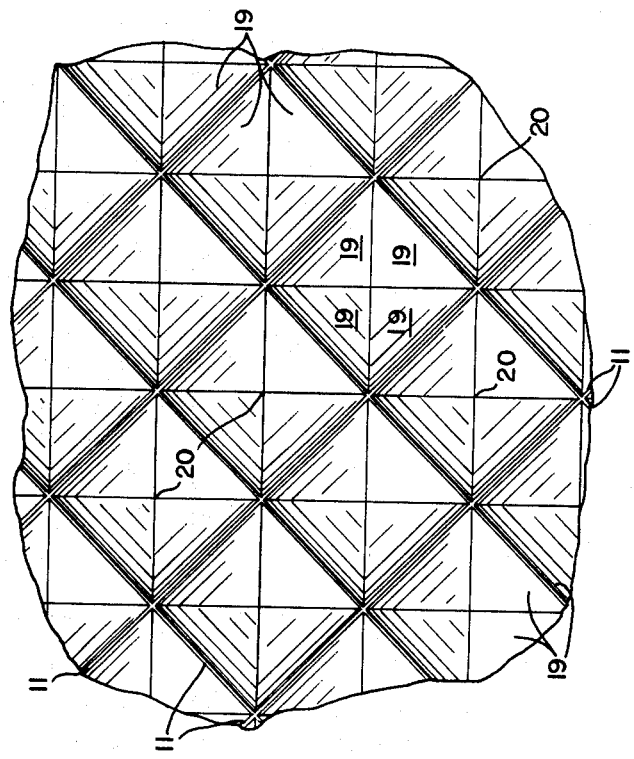

United States Patent [19]

Lindmayer

[11] 4,348,254

[45] Sep. 7, 1982

[54] METHOD OF MAKING SOLAR CELL

[75] Inventor: Joseph Lindmayer, Bethesda, Md.

[73] Assignee: Solarex Corporation, Rockville, Md.

[21] Appl. No.: 159,445

[22] Filed: Jun. 13, 1980

Related U.S. Application Data

[60] Continuation of Ser. No. 973,760, Dec. 27, 1978, abandoned, which is a division of Ser. No. 860,892, Dec. 15, 1977, abandoned.

[51] Int. Cl.³ ............................................. H01L 21/306
[52] U.S. Cl. ...................................... 156/647; 29/572; 148/1.5; 148/186; 148/187; 156/651; 156/657; 156/659.1; 156/662; 252/79.5; 357/30; 357/55
[58] Field of Search ........................... 357/30, 55, 58; 252/79.5; 29/572; 148/175, 187, 1.5, 177, 186; 136/89 SJ, 89 CC; 427/85, 93, 95; 156/647, 648, 653, 657, 662, 651, 659.1

[56] References Cited

U.S. PATENT DOCUMENTS

| | | | |
|---|---|---|---|
| 3,150,999 | 9/1964 | Rudenberg et al. | 136/89 |
| 3,953,264 | 4/1976 | Wu | 156/647 X |
| 3,969,746 | 7/1976 | Kendall et al. | 357/30 |
| 4,046,594 | 9/1977 | Tarui et al. | 357/30 X |
| 4,072,541 | 2/1978 | Meulenberg et al. | 357/60 X |
| 4,135,950 | 1/1979 | Rittner | 357/30 X |
| 4,137,123 | 1/1979 | Bailey et al. | 156/647 |

FOREIGN PATENT DOCUMENTS 751084  1/1967  Canada .................................. 357/30

OTHER PUBLICATIONS

Rev. Sci. Instrum., vol. 44, No. 12, Dec. 1973, Microtool Fabrication by Etch Pit Replication, by D. A. Kiewit, pp. 1741-1742.

Primary Examiner—William A. Powell
Attorney, Agent, or Firm—Watson, Cole, Grindle & Watson

[57] ABSTRACT

A silicon solar energy cell having improved anti-reflective properties and resistance to radiation is composed of a light receiving surface having spaced indentations in the form of inverted pyramids therein. The pyramids, which have their bases in the plane of the light-receiving surface, are produced by masking the surface with a layer resistant to attack by a silicon etchant, forming open regions in the mask, then etching the major surface through the exposed regions.

9 Claims, 2 Drawing Figures

METHOD OF MAKING SOLAR CELL

This is a continuation of application Ser. No. 973,760 filed Dec. 27, 1978, which was a division of application Ser. No. 860,892, filed Dec. 15, 1977, both now abandoned.

This invention generally relates to silicon solar energy cells that have at least one major surface for receiving and absorbing light impinging thereon. More specifically, it relates to such cells that find use in generating electricity in a terrestrial ambience, although it is also applicable to cells utilized as power sources for orbital satellites and other facilities that are located in space and, therefore, do not have the benefit of an atmopshere to attenuate the bombardment of the cell by particles of energy.

For many years a problem that has been known to those skilled in the solar cell art but not satisfactorily resolved has been to minimize the reflection of light striking a light-absorbing surface of a solar cell and increase absorption thereof. Although anti-reflective coatings composed, e.g., of tantalum or niobium pentoxide, are well recognized as having utility in this regard, cells bearing these coatings have been found to absorb useful light and not to be completely effective at all useful wavelengths.

Another mode of increasing absorption of available light, which manner has recently been the subject of some attention, has been to texturize the light-impinging surface of the cell. In a typical application of this technology, the surface of the cell is etched with a potassium hydroxide or sodium hydroxide solution to develop a cell surface in which upstanding pyramids are formed thereon. These pyramids are of a random size. The purpose of the upstanding pyramids on the cell surface is to trap light, i.e., light that is not absorbed by the cell at a major surface would be reflected, hopefully to another pyramidal structure or the major surface, and absorbed by the surface or reflectee pyramid.

The trapping of light by means of upstanding structures on the surface of a solar cell has definite disadvantages, although those structures will in principle increase absorption of available light. Among such disadvantages is the fact that the pyramid tips, or portions of any upstanding structure on the cell surface, may break off in handling. Since a cell with a texturized surface is subjected to impregnation with a junction-forming impurity after the texture has been formed, if the tip of a pyramid thereafter breaks off, the portion of the cell where the tip formerly was will have no photovoltaic juncton. Consequently, the efficiency of the cell will be decreased. Moreover, an electrode metalization pattern in the form of a grid is difficult to apply because of the upstanding, sharp points. Thus, the metal grid pattern in some instances will have to span adjoining points, which makes the grid subject to breakage. Further, since at least the base metal of the metallized pattern is ordinarily applied by shadow mask procedures, the application of the shadow mask to the cell surface may break the tops of the upstanding pyramids, in which case double masking will be required or the grid pattern will be discontinuous. Perhaps the most important disadvantage is that when the metallic grid pattern contacts a pyramid that had had its top broken off, thereby exposing the p and n regions, the grid will short the cell. These difficulties, particularly the probability of shorting the cell, have resulted in the failure of texturized surfaces to be widely utilized in the field of photovoltaics.

In another aspect, solar cells have been an important part of space programs in the United States because of their use as primary sources of electrical energy for space vehicles. Thus, programs have been conducted to increase the efficiency of the cells and thereby lead to reduced costs and improved performance of space missions where the vehicles are powered by solar cells. However, most recent work in silicon solar cell development has concentrated on improvements in the beginning-of-life efficiency of the cell. This is certainly an important factor and leads to cells that will be more economical for terrestrial use. Yet, in space the cells are subject to bombardment by particulate energy that has not been mitigated by the atmosphere surrounding the earth. Consequently, the cells that are used for the space program have been found to have an appreciably shorter life than those that are used for terrestrial purposes only. Indeed, it is generally understood that solar cells used to power orbiting satellites have a useful life of approximately seven to ten years. Therefore, the useful life of any satellite has normally been limited to that of the cells that power it, i.e., about seven to ten years. Over a period of time continuous efforts have been directed to the improvement of the radiation resistance of solar cells.

Among efforts that have been made to improve radiation resistance of solar cells by changing the physical form of the cell junction has been the so-called vertical junction cell. Such a cell has been the subject of a scientific paper entitled, New Development in Vertical-Junction Solar Cells, presented at the Twelfth IEEE Photovoltaic Specialists Conference—1976, held Nov. 15-18, 1976 at Baton Rouge, La. A copy of that paper is submitted for incorporation in the file of this patent application. In general, the purpose of forming vertical channels in the 1-0-0 -surface of a solar cell, whereby the subsequently formed photovoltaic junction extends vertical channels inwardly from the cell surface, is to bring junction closer to the light energy absorbed by the cell. Since defects in cell structure caused by outer space exposure can reduce the collection efficiency of light-generated carriers, decreasing the distance between the carriers and the junction increases the likelihood that such carriers will reach the junction.

Vertical junction cells, however, while being definitely advantageous in terms of radiation resistance, i.e., operativeness despite damage, do have the disadvantage of being fairly difficult to manufacture precisely. As far as is presently known, they can only be produced in a surface on the 1-1-0 plane of monocrystalline silicon, in which the common planes are 1-1-1 and 1-0-0. As a consequence, vertical junction cells are difficult to reproduce uniformly and are relatively expensive to manufacture. However, there is no question but that grooved solar cells with vertical junctions have a degradation rate upon irradiation that is markedly less than that of silicon solar cells where the junction is planar. With respect to increased absorption of light, such increases may be obtained when the walls separating the grooves are very thin, but then the structure is extremely fragile.

The solar energy cell towards which the present invention is directed employs some of the advantages of the vertical junction cell, with its attendant improved resistance to radiation damage, and the texturized cell, with its improved absorption but without its tendency to be readily subject to physical damage. It is, therefore, the primary object of the present invention to provide a solar energy cell having a surface adapted to receive and fully absorb light impinging thereon, which cell will resist a decrease in efficiency due to radiation damage to a greater extent than a cell having a planar junction.

Concisely, a solar energy cell according to my invention set forth herein is one that has a major surface adapted to receive light impinging thereon, which surface is formed with a plurality of indentations having their bases in the plane of the major surface. These indentations generally define voids in the shape of a geometric figure, namely, a pyramid. Generally, the greatest area of the figure in any cross-section parallel to the major surface will be at the surface of the cell. As a consequence, when the geometric figure is a pyramid, the cell body will delimit voids that have the form of pyramids with their apexes extending vertically inwardly from the surface of the cell and the bases of the pyramids lying in the plane of that surface. Most preferably, the pyramids will be spaced uniformly along the surface of the cell and will occupy at least 90 percent of that surface.

As a result of utilizing a cell having a structure such as that just described, i.e., one having a series of voids in the shape of inverted pyramids formed in the cell surface, a cell is produced that is resistant to radiation and, when it does reflect light, is likely to reflect that light to another of the surfaces formed by the pyramid so that the light energy can thence be absorbed by that surface. Further, the disadvantages inherent in textured cells having upstanding pyramids are avoided; there are no upstanding structures to be broken off or otherwise altered on handling of the cell. Yet the ability of the cell surface to reflect light to another absorbing surface is maintained in the manner of a cell having upstanding pyramids.

One important advantage of a cell according to the present invention is that it lends itself to a relatively simple yet efficient method of production. Such method makes use of the ability of certain etchants to attack silicon readily while failing successfully to attack certain other materials. For example, it is well known that potassium hydroxide and sodium hydroxide will etch silicon, yet will not readily attack other materials, such as oxides of silicon. Thus, broadly stated, the present inventive method comprises masking the surface of a silicon wafer with a layer that is resistant to attack by such a silicon etchant, then forming open regions in the masking layer to expose substantially symmetrical portions of the surface of the silicon wafer underlying those regions. The surface masked is ordinarily the 1-0-0 surface of the silicon. Thereafter, a silicon etchant is applied to the masking layer, including the open regions therein. The silicon etchant will penetrate through the open regions in the masking layer and contact and etch the surface of the wafer, thereby forming pyramidal or other geometric structures inwardly of the surface. Thereafter, the masking layer is removed and, after suitable washing, an impurity is diffused or otherwise introduced into the body of the silicon cell, which has previously been doped. Diffusion creates the usual n-p or p-n junction inwardly of the cell surface, that junction extending along the entire surface of the cell, including the indentations formed in that surface.

One method that has been found simple and effective is to utilize steam to form an oxide layer on a silicon cell. The steam will create a layer of silicon dioxide that covers the entirety of the major surface of the cell to be etched. Then, by means of photolithography, the silicon dioxide layer is selectively etched by an etchant that readily attacks silicon dioxide but does not readily attack silicon. In this manner a series of open regions are formed across the entirety of the layer of silicon dioxide that overlies the major surface of the cell. After such open regions have been formed, a silicon etchant is applied through the open regions to form a series of inverted pyramids across the entire surface of the cell. Then the silicon dioxide layer is etched away in its entirety, the cell washed and an impurity diffused or otherwise applied to the structured surface of the cell to form an electrical junction inwardly of that surface.

Figure 1:
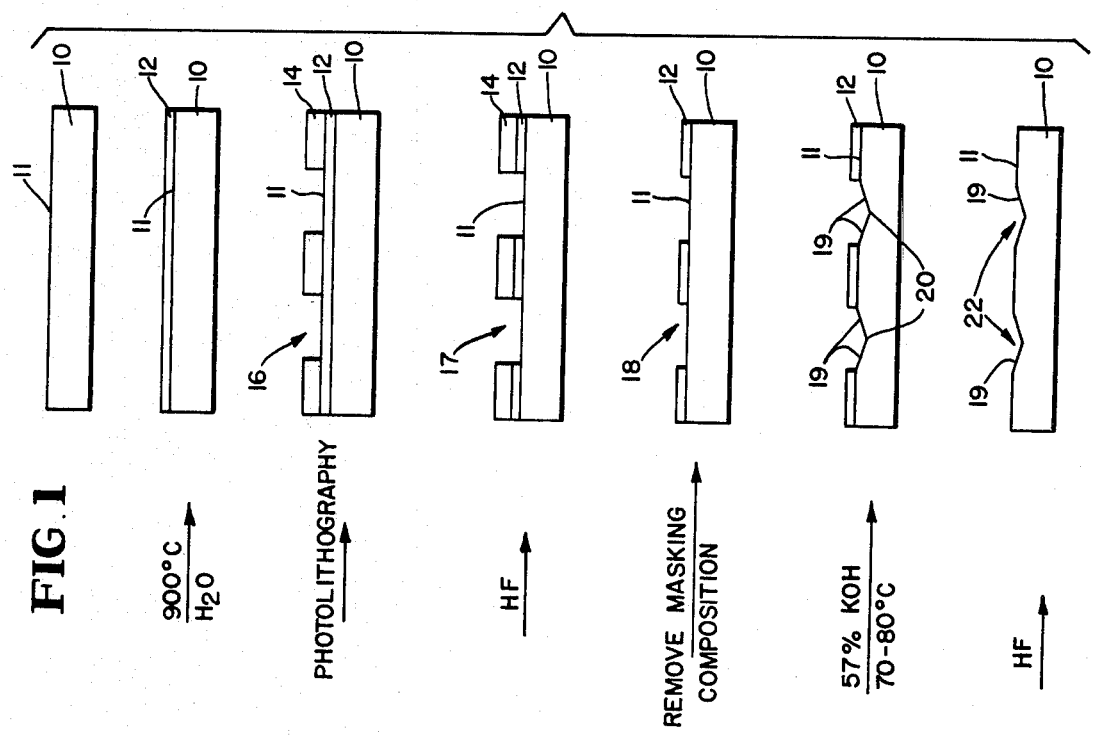

These and other objects, features and advantages of the present inventive method and product will be more apparent when considered in connection with the accompanying drawing, which sets forth preferred embodiments of my invention, and in which:

FIG. 1 is a flow diagram of a preferred embodiment of the method of my invention, and FIG. 2 is a top plan view of a solar cell surface produced by the practice of the method illustrated schematically in FIG. 1.

Referring now to the drawing, and in particular to the flow diagram that constitutes FIG. 1 thereof, a silicon wafer 10 of a desired size, for example, a disk three inches in diameter and 10 mils in thickness composed of substantially monocrystalline silicon that had been doped with boron, is provided. Suitably protected, the wafer 10, which has a major surface 11 in the 1-0-0 crystallographic plane of the silicon, was subjected to an atmosphere of steam at 900° C. for one-half hour. After steam treatment, the cell had its surface 11 covered with a masking layer 12 of silicon dioxide. Layer 12 was of substantially uniform thickness of about 2,000 Å.

A layer of photoresist 14 was then applied uniformly on the silicon dioxide coating or layer 12. This photoresist layer typically is that set forth in my copending U.S. Application Ser. No. 614,618, filed Sept. 18, 1975, now abandoned, which is illustrative of photolithographic techniques that may be used in producing a patterned mask. The film layer 14 was then photographed in a pattern of minute holes spaced from each other on their centers by approximately 30 microns. Then a solvent was applied and those portions of the film 14 that had been exposed photographically were dissolved in the solvent bath. With such portions dissolved, the silicon wafer was of the form shown in the third of the schematic illustrations of FIG. 1, i.e., the portions 14 were spaced from each other by open regions 16 atop the continuous silicon dioxide layer 12.

Now an etchant for silicon dioxide, but not for silicon or the photoresist layer, was applied to the entirety of the wafer 10. In this instance the etchant used was hydrofluoric acid. Having been dipped in hydrofluoric acid, the wafer was in substantially the form next illustrated schematically, i.e., the open regions 16 in the photoresist layer 14 had been expanded through the silicon dioxide layer 12 down to the surface 11 of the cell. For clarity, those open regions as so extended have been designated by reference numeral 17. Now the remainder of the layer 14 was removed by dipping in an organic solvent, e.g., acetone, and the cell had the structure illustrated schematically in the fifth view of FIG. 1, in which the smaller open regions 18 still extend to the surface 11 of the silicon wafer 10. In this form there was a pattern of open regions 18 uniformly spaced across the entire major surface 11 of the wafer. The pattern was composed of a continuum of silicon dioxide 12 which open regions 18 had been formed.

As the next step, the wafer with its silicon dioxide layer 12 was immersed in a bath of silicon etchant, in this instance a 5% solution of KOH at 70° to 80° C., for approximately five minutes. Since KOH is an etchant for silicon but does not successfully attack silicon dioxide, after etching with KOH the silicon dioxide layer 12, as perforated by open regions 18, was substantially unchanged. However, etching of the surface 11 of the silicon wafer 10 was accomplished. When such etching took place in the 1-0-0 crystallographic plane of the monocrystalline silicon, the result was an etched surface having inclined planes 19, which planes extended inwardly into the body 10 of the wafer and terminated in a downwardly extending apex 20. Now the wafer was again subjected to treatment with hydrofluoric acid, whereupon the silicon dioxide layer 12 was completely removed. The result was a wafer such as is illustrated in the last part of the flow diagram that constitutes FIG. 1, i.e., the wafer was formed with uniformly distributed open regions or indentations 22 in its major surface 11, the voids of such indentations being bounded by inclined planes 19 that terminate in apices 20.

Another greatly enlarged view of the cell schematically illustrated in the last part of the flow diagram of FIG. 1 herein is that shown in FIG. 2. As will there be seen, etching with KOH on the 1-0-0 plane of the monocrystalline silicon resulted in a surface having voids in the form of inverted pyramids with four inclined surfaces 19 terminating in a single apex 20 for each indentation or void. The indentations formed by planes 19 cover more than 50% of the surface 11 remaining in the cell. Indeed, in the preferred embodiment as I presently view it, the indentations occupy more than 90% of the major surface 11 of the cell, at which surface light is to be received and absorbed by the cell. From measurements made thus far, the apex of each pyramidal indentation extends into the body of the cell to a depth of about 20 microns. Each base of its respective inverted pyramidal void is approximately 15 microns in length and about the same in width; the width of the surface portion 11 of the cell surface remaining between and separating adjoining indentations is about one micron.

It is an important feature of the present invention that the exposed areas of the surface 11 underlying the open regions in the coating 12 be substantially symmetrical. By the use of the term, substantially symmetrical, I do not mean to exclude exposed portions that in plan view are other than round or square. Thus, I include within the scope of my invention open regions that may vary, e.g., by a factor of two in comparing the largest to the smallest of their dimensions, although I presently contemplate that perfectly symmetrical exposed portions of the surface would constitute my most preferred embodiment.

An additional feature of the present invention is to provide a structured surface of inverted pyramidal voids on both major surfaces, i.e., the front and back surfaces, of a silicon wafer. Then the back wafer surface, which is not to be exposed to light, will have its voids filled with a heat-conductive metal, such as solder. In this form, the front structured surface of the cell will perform its light absorbing function, and the back surface will act as a heat sink to transfer heat away from the remainder of the cell and thereafter into contact with a heat-dissipating medium, e.g., air or water.

It will be understood by those skilled in this art that my inventive process and product have been illustrated and described by means of preferred embodiments thereof for the purpose of illustration only. Thus, the specific dimensions of the inverted pyramidal indentations in the cell have been utilized to show what I presently consider to be the most advantageous size. However, experimentation may well show that other sizes of indentations will offer certain advantages, particularly when related to the specific use to which the cell is to be placed. In addition, methods other than photolithography may be utilized in order to locate the open regions in the silicon dioxide or other masking layer to be applied to the light impinging surface of the cell. For example, such open regions could be otherwise defined, e.g., by applying a mask to the surface of the cell and etching the indentations in the cell surface through the mask. However, since great precision is required and the mask, itself, would have to be resistant to the silicon etchant, I have found it most expeditious to use the process described hereinbefore. Additionally, etching of the wafer surface can also take place through open regions in a coating of titanium or titanium dioxide, which would have the advantage of being applied at a lower temperature, thereby avoiding possible heat damage to the cell.

As to all modifications and alterations that may be obviously made in the preferred embodiments hereinbefore described, it is desired that these changes be deemed to be included within the purview of my invention, which I desire to be limited only by the scope, including equivalents, of the following, appended claims.

I claim:

1. A method of making a silicon solar cell having at least one major surface adapted to receive light impinging thereon and absorb and convert such light into electrical energy, comprising providing a silicon wafer having at least one major surface thereof subject to attack by a silicon etchant, masking said surface with a layer resistant to attack by said silicon etchant, said masking layer being formed with open regions therein that expose substantially symmetrical portions of said surface of said silicon wafer, etching said exposed portions of said surface through said open regions of said masking layer with said silicon etchant to produce indentations in said surface, said indentations being in the form of inverted pyramids the apices of which are located inwardly of and the bases of which lie substantially in the plane of said surface, and thereafter forming an electrical junction at said surface, said junction extending along said surface and inwardly thereof into said indentations.

2. A method of making a silicon solar cell as claimed in claim 1, in which said masking layer is substantially uniform and covers the entirety of said major surface.

3. A method of making a silicon solar cell as claimed in claim 1, in which said masking layer is the reaction product of silicon and an externally applied reagent.

4. A method of making a silicon solar cell as claimed in claim 3, in which said open regions of said masking layer have been formed by etching with an etchant that does not readily attack silicon.

5. A method of making a silicon solar cell as claimed in claim 1, in which said masking layer is composed of titanium.

6. A method of making a silicon solar cell having at least one major surface adapted to receive and absorb light impinging thereon and convert such light to electrical energy, comprising providing a silicon wafer having a major surface in the 1-0-0 plane of the crystalline silicon, said silicon being subject to attack by a silicon etchant, reacting said surface with an oxidizing agent to form a layer of an oxide of silicon overlying said surface, selectively etching said oxide layer on said surface with an oxide etchant that is not an etchant for silicon to form open regions in said oxide layer extending through said oxide layer to expose underlying portions of said major surface of said wafer, etching said exposed portions of said surface through said open regions in said oxide layer with a silicon etchant that is not an etchant for said oxide layer to produce indentations in said major surface, said indentations being in the form of inverted pyramids the apices of which are located inwardly of and the bases of which lie substantially in the plane of said surface, and thereafter forming an electrical junction at said surface, said junction extending along said surface and inwardly thereof into said indentations.

7. A method of making a silicon solar cell as claimed in claim 6 in which said oxidizing agent is steam and said oxide layer is comprised of silicon dioxide.

8. A method of making a silicon solar cell as claimed in claim 6, in which said oxide layer is removed subsequent to the formation of said indentations in said major surface.

9. A method of forming a silicon solar energy cell as claimed in claim 6, in which said oxide layer is selectively etched through a coating having spaced uncoated portions thereof, said uncoated portions being produced by means of photolithography.

* * * * *